United States Patent
Wood

[11] Patent Number: 5,965,910
[45] Date of Patent: Oct. 12, 1999

[54] LARGE CELL CHARGE COUPLED DEVICE FOR SPECTROSCOPY

[75] Inventor: Mark B. Wood, Bountiful, Utah

[73] Assignee: Ohmeda Inc., Louisville, Colo.

[21] Appl. No.: 08/841,061

[22] Filed: Apr. 29, 1997

[51] Int. Cl.[6] .................... H01L 27/148; H01L 29/768
[52] U.S. Cl. .................... 257/231; 257/236; 257/241; 257/245; 257/249
[58] Field of Search .................... 257/231, 233, 257/236, 241, 245, 249

[56] References Cited

U.S. PATENT DOCUMENTS

| | | |
|---|---|---|
| 4,067,001 | 1/1978 | Hoffmann . |
| 4,079,238 | 3/1978 | Campe et al. ............... 365/824 |
| 4,168,444 | 9/1979 | Van Santen . |
| 4,191,896 | 3/1980 | Sauer et al. ............... 307/221 D |
| 4,195,273 | 3/1980 | Prince ............... 333/165 |
| 4,206,371 | 6/1980 | Weimer ............... 307/221 D |
| 4,468,684 | 8/1984 | Esser et al. ............... 357/24 |
| 4,476,568 | 10/1984 | Prince ............... 377/60 |
| 4,547,677 | 10/1985 | Parker ............... 250/578 |
| 4,760,558 | 7/1988 | Berger et al. ............... 365/183 |
| 4,799,109 | 1/1989 | Esser et al. ............... 358/213.28 |
| 4,807,037 | 2/1989 | Iesaka et al. ............... 358/213.31 |
| 5,073,808 | 12/1991 | Kinoshita . |
| 5,210,433 | 5/1993 | Ohsawa et al. ............... 257/250 |
| 5,250,824 | 10/1993 | Janesick ............... 257/216 |
| 5,338,948 | 8/1994 | Sims ............... 257/249 |
| 5,483,091 | 1/1996 | West et al. ............... 257/239 |
| 5,485,207 | 1/1996 | Nam ............... 348/321 |

*Primary Examiner*—Ngân V. Ngô
*Attorney, Agent, or Firm*—Holme Roberts & Owen LLP

[57] ABSTRACT

The present invention is directed to an improved CCD utilizing a potential gradient along the lengths of the various channels of the CCD during charge transfer to cause generated electrical charge to migrate along the length of the channel to a summing well. The potential gradient is formed by biasing the opposing ends of the electrodes overlying the lengths of the various channels with different voltages.

38 Claims, 9 Drawing Sheets

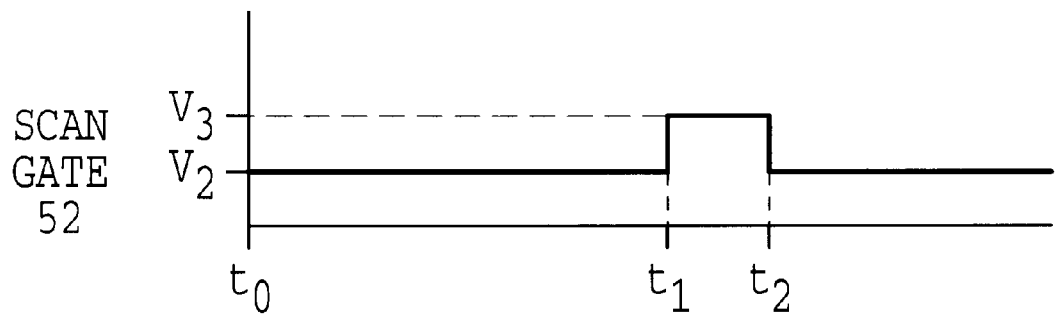
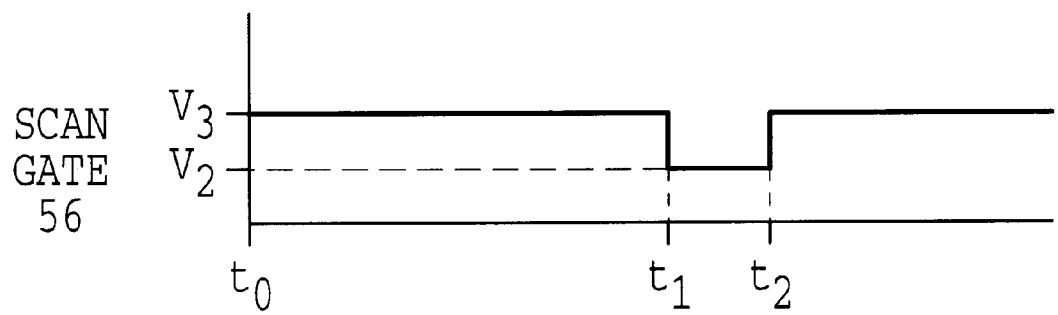
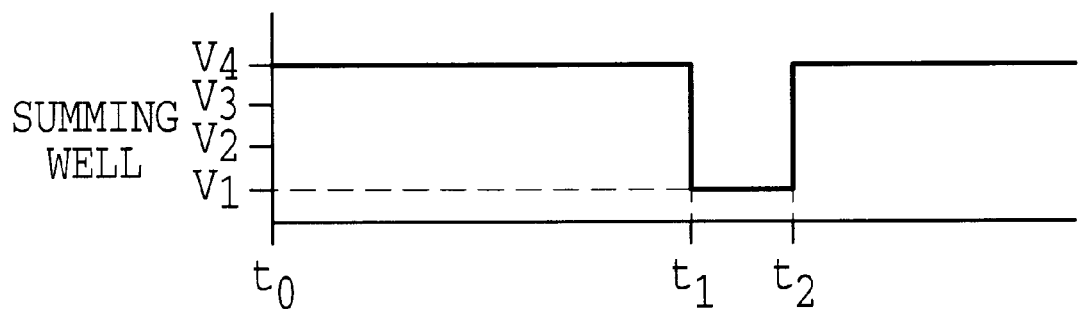
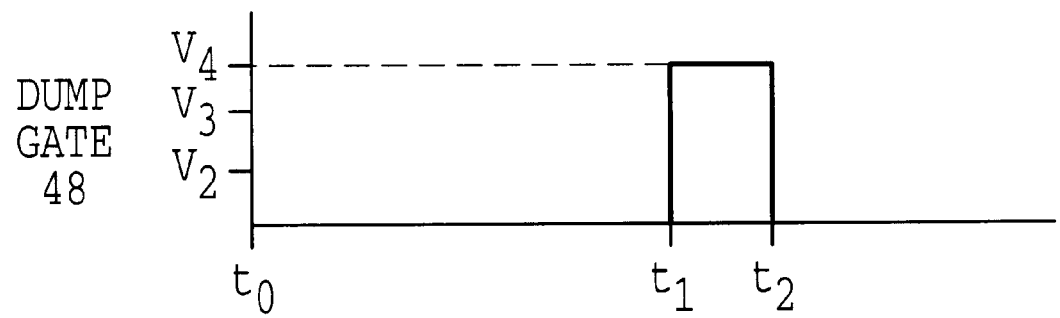
FIG.8

LARGE CELL CHARGE COUPLED DEVICE FOR SPECTROSCOPY

FIELD OF THE INVENTION

The present invention relates generally to charge coupled devices (CCDs) and is particularly apt for CCDs employed in spectrometers for gas analysis.

BACKGROUND OF THE INVENTION

CCDs are used in a variety of applications, such as spectrometry, imaging, digital memories, various logic functions, and signal processing, for accumulating, storing and/or transferring electrical charges. The basis of a typical CCD is the dynamic storage and withdrawal of electrical charge in a series of metal-oxide-semiconductor ("MOS") capacitors. To define the MOS capacitors, the CCD can include a number of metal gate electrodes positioned adjacent to an oxide-semiconductor substrate. In response to an applied electrical potential, a depletion region is formed under a gate electrode, and the surface potential increases considerably under a gate electrode. The potential well is used for accumulation and/or storage of electrical charge. The substrate further includes a number of channel stops for laterally confining the stored electrical charge(s) in a number of channels, each containing a plurality of potential wells.

In known CCDs, to transfer electrical charge(s) within each channel, adjacent gate electrodes are cyclically biased at predetermined intervals with different electrical potentials to create adjacent potential wells of differing depths. The electrical charges move along the channels from shallower potential wells beneath gate electrodes having a low electrical potential to deeper potential wells beneath gate electrodes having a high electrical potential. By alternately biasing adjacent gate electrodes at timed high and low electrical potentials, electrical charges can be sequentially shifted down the channels for processing and/or collection.

In light dispersive spectrometry applications, electrical charges are accumulated in potential wells during an integration period. The charge results from photons of radiation contacting a radiation-sensitive substrate. The amount of charge accumulated in each potential well is a function of the incident radiation intensity and the duration of exposure. Typically, the electrical charges accumulated in each channel are sequentially combined during shifting in a potential well in a process known as binning.

As will be appreciated, signal losses can occur in a CCD in light dispersive spectrometry applications. By way of example, a portion of the radiation can be absorbed by the relatively thick and wide polysilicon electrodes used in charge shifting. The polysilicon can act as an absorption filter preventing light in the visible, UV and near IR from reaching the channels. This absorption reduces the quantum efficiency of the CCD. Spurious charge can be generated when the phase clock drives are driven in and out of inversion (i.e., charge generation) during charge shifting (i.e., charge transfer from pixel to pixel). A fraction of an electrical charge can be generated with each charge shift between pixels. It is an obvious design consideration to minimize CCD noise to maximize the accuracy, responsiveness, and/or reliability of the CCD.

SUMMARY OF THE INVENTION

It is an objective of the present invention to provide a CCD that has reduced noise and/or reduced radiation losses and/or increased resolution, thereby enhancing the accuracy, responsiveness and/or reliability of the CCD.

More particularly, it is an object to provide a CCD with reduced noise from impact ionization and/or reduced radiation losses from passing radiation through material(s) overlying the radiation sensitive substrate. The realization of this objective is especially desirable for CCDs in which the stored electrical charges are relatively small, combined during binning, and/or shifted at a high frequency, such as spectroscopy CCD applications in the medical field (e.g., for anesthetic/respiratory gas analysis).

A further objective is to provide a CCD that is relatively simple, inexpensive, and reliable, can operate at high sampling frequencies, and can produce a high signal to noise ratio for the CCD.

These and other objectives are addressed by the CCD of the present invention which utilizes a novel architecture. In one aspect of the present invention, the CCD includes (i) radiation sensing means for generating electrical charge in response to incident radiation received along a length of the radiation sensing means during an integration interval; (ii) charge storage means for storing the electrical charge; and (iii) biasing means for establishing a potential gradient along the length of the radiation sensing means to transfer the electrical charge to the charge storage means during a shifting interval. Substantially continuously throughout the shifting interval, a first electrical potential along the potential gradient is more than a second electrical potential at a different location along the potential gradient.

The biasing means can include a plurality of adjacent electrodes and at least two voltage sources. The plurality of adjacent electrodes is oriented substantially parallel to a plurality of parallel channels in the radiation sensing means. To provide the potential gradient during the shifting interval, the upper ends of the plurality of adjacent electrodes are biased with a voltage $V_1$, and the lower ends of the plurality of adjacent electrodes are biased with a voltage $V_2$. The absolute value of $V_1$ is less than the absolute value of $V_2$.

Compared to prior art CCDs, the CCD substantially reduces the total amount of false charge from impact ionization by reducing, for a given charge readout cycle, the number of times in which the CCD is driven in and out of inversion. During charge readout, the potential gradient along the length of the radiation sensing means causes electrical charge generated in the radiation sensing means to migrate to a horizontal charge readout register that can include a summing well for charge collection. For a given charge readout cycle, the electrodes can be driven out of inversion only once at the conclusion of the integration period to clear unwanted electrical charge(s), such as thermally generated dark charge, from the radiation sensing means. Accordingly, if the radiation sensing means were to include a number of channels and k electrons were to be collected in one of the channels (each channel being equivalent to a single pixel), only k electrons of spurious charge would be collected in the channel compared to kN×N electrons of spurious charge a prior art binned CCD having N plate electrodes overlying the channel. Because the CCD of the present invention can have a relatively slow rise time (due to the need for fewer shifts per readout cycle compared to prior art CCDs), k can be significantly reduced and spurious charge virtually eliminated.

Compared to prior art photodiodes, the CCD of the present invention has low noise levels. As will be appreciated, there are three major sources of noise in a photodiode array: reset noise, shot noise and amplifier noise. Reset noise is associated with resetting the diode capacitance to a fixed voltage. The root mean square (RMS) value of the shot noise is the square route of the number of electrons in the dark-signal charge. Amplifier noise depends on the amplifier circuit used. A typical noise level for a photodiode array is approximately 1500 electrons per pixel, with the major contributor being the reset noise. As with other prior art CCDs, the present invention realizes much lower noise than a photodiode due to significantly lower readout noise.

The shifting interval can be discrete from or overlap the integration interval. To substantially minimize noise from dark current, it is most preferred that charge generation and transfer be performed during discrete time intervals.

In one embodiment, the CCD includes a plurality of adjacent electrodes that are substantially parallel to a plurality of parallel channel stops in the radiation sensing means, thereby permitting the use of electrodes having relatively low thicknesses and widths. For example, the electrode width can be less than the width of the channel (i.e., the width being the distance between the adjacent sides of the channel stops defining the channel). This allows transfer of electrons down a narrow channel to maximize charge transfer efficiency. By using narrower and thinner electrodes than prior art CCDs, the CCD of the present invention can reduce quantum losses from incident radiation passing through materials overlying the radiation sensitive substrate to levels comparable to that for backside illuminated CCDs and provide increased CCD resolution through a denser distribution of channels. Because the CCD of the present invention permits the RC time constant of the CCD electrodes to be two or three orders of magnitude larger than that of prior art electrodes, the electrodes overlying the radiation sensing means can have a relatively small thickness and width relative to electrodes of prior art CCDs. Further reductions in electrode width can be realized through the use of a single potential well that is substantially continuous along the length of each of the channels. The use of such a potential well is a benefit of having substantially parallel electrodes and channels. The continuous potential well enables the electrode width to be determined by maximum charge capacity of the potential well (which is generally low in spectroscopy applications) rather than by the need for close electrode spacing which effects charge transfer efficiency in prior art CCDs.

The plurality of adjacent electrodes can be electrically connected in parallel to a common voltage source. The common voltage source is connected to the ends of the electrodes located at one end of the CCD. This electrode configuration permits the various electrodes to be driven in and out of inversion simultaneously.

As noted above, the potential gradient can be formed by biasing the opposing end of an electrode with different voltage levels. The absolute value of the first voltage level or $V_1$ is less than the absolute value of the second voltage level $V_2$ to form the potential gradient.

To clear electrical charge(s), such as spurious charge and/or dark current, rapidly from the radiation sensing means at the beginning of the selected integration interval, the voltages $V_1$ and $V_2$ can be switched at the opposite ends of the electrode during a time interval after the shifting interval. Thus, after the shifting interval, a first portion of the electrical charge is transferred to a first end of the electrodes for charge removal, and a second portion of the electrical charge is transferred to a second end of the electrodes during the shifting interval for charge collection and/or processing. The biasing means can include a transistor, such as a MOSFET, for providing a current path for the unwanted electrical charge during removal thereof from the CCD. The unwanted electrical charge can be collected in a charge dumping well before removal. In this manner, the unwanted electrical charge can be cleared quickly from one or more channels of the CCD to provide very short effective shutter times.

The CCD can be configured to permit the electrical charge generated in the various channels to be read selectively and at different times. To realize this result, the biasing means includes means for transferring, over the first shifting interval, electrical charges stored in a first channel and/or summing well to a horizontal readout register and for transferring, over a second shifting interval discrete from the first shifting interval, electrical charges stored in a second channel and/or summing well to the horizontal readout register. The biasing means thus can selectively bias one or more of the plurality of electrodes independently of the other electrodes to transfer selectively electrical charge in one or more channels to the horizontal readout register. Where a spectrum of wavelengths is spatially distributed across the face of the CCD, the ability of the CCD to select the time interval for charge integration and readout on a channel-by-channel basis permits optimization of the sampling frequency and the signal-to-noise ratio for each wavelength of the spectra.

In another aspect of the present invention, the CCD includes: (i) charge holding means for holding electrical charge, the charge holding means having a first length and (ii) an arrangement configured for establishing a gradient in electrical potential along the first length. The arrangement is in electrical contact with the charge holding means to transfer electrical charge along the first length in response to the potential gradient. The magnitude of the electrical potential varies continuously along the first length.

In yet another aspect, the present invention includes a method for transferring electrical charge in a CCD. The method includes the steps of: (i) generating electrical charge in a charge holding portion of the CCD and (ii) applying, during the shifting interval, a potential gradient along a length of the charge holding portion to transfer the electrical charge along the length. Substantially continuously throughout the shifting interval, the first electrical potential along the potential gradient is more than the second electrical potential at a different location along the gradient.

Another aspect of the present invention provides a method for transferring selectively electrical charge in a CCD having a CCD inversion potential. The method includes the steps of: (i) maintaining during the integration interval a first channel of the CCD below the CCD inversion potential to enable electrical charge to form in the channel and (ii) applying, during the shifting interval, a voltage to a second channel to transfer electrical charge along the second channel, wherein the voltage is above the CCD inversion potential.

BRIEF DESCRIPTION OF THE DRAWINGS

FIG. 8 depicts input voltage waveforms for various inputs of another embodiment of the CCD;

DETAILED DESCRIPTION OF THE INVENTION

The CCD of the present invention uses a novel architecture to substantially reduce false charge formation, increase quantum efficiency, and increase CCD resolution. The CCD employs a gradient in the electric potential along all or substantially all of the entire length of the channels during charge shifting to define a potential well that varies in depth continuously along the entire length of a given channel. The potential well transports the electrical charge along the channel for collection. The potential gradient can be formed by using electrodes placed in parallel over the channels rather than perpendicular to and crossing the channels as in the prior art. The electrodes are connected to separate voltage sources at the upper and lower ends of the electrodes. The potential gradient results from an offset in the voltages applied by the two voltage sources. The potential gradient allows electrical charge(s) to "slide" down the potential gradient to the end of the channels to a charge collecting well.

The substantially continuous formation and migration of the charges in the CCD of the present invention provides distinct advantages relative to the pixel-by-pixel shifting of prior art CCDs. The advantages include (i) the use of thinner and narrower electrodes thereby providing increased quantum efficiency and CCD resolution; (ii) the use of a substantially continuous potential well along substantially the entire length of the channel, thereby reducing the number of shifts above the CCD inversion potential per charge readout cycle and the amount of spurious charge generation; and (iii) the use of fewer shifts per charge readout cycle, thereby reducing the duration of the shutter time of the CCD.

FIGS. 1–6 depict a first aspect of the present invention. The n channels in the CCD 10 define a linear array. The CCD 10 includes radiation sensing means 14 for generating electrical charge in response to incident radiation received along the length of the radiation sensing means 14 and biasing means 18 for establishing a potential gradient along the length of the radiation sensing means 14.

Figure 1:
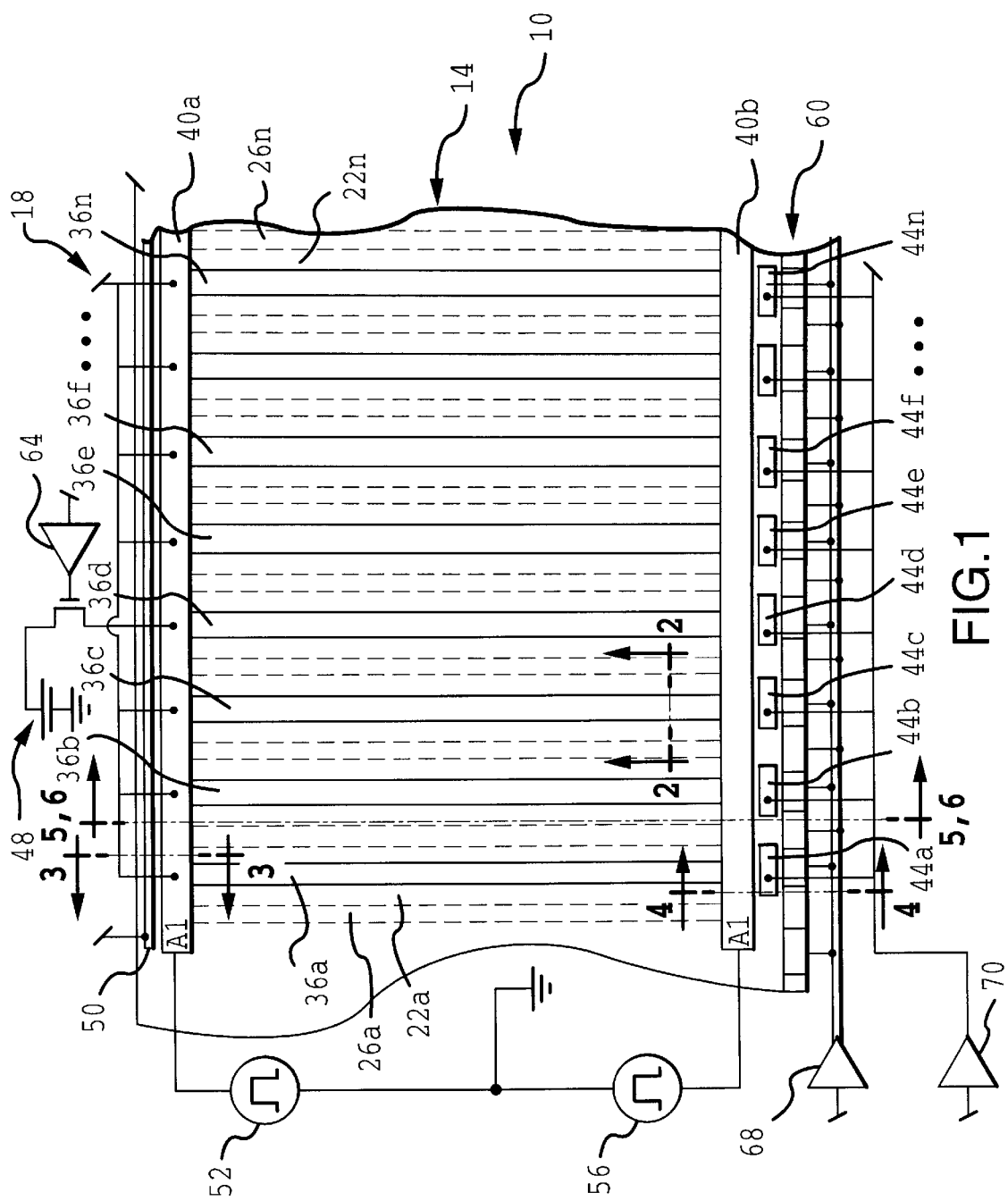
FIG. 1 is a plan view of a CCD according to one embodiment of the present invention.
Figure 2:
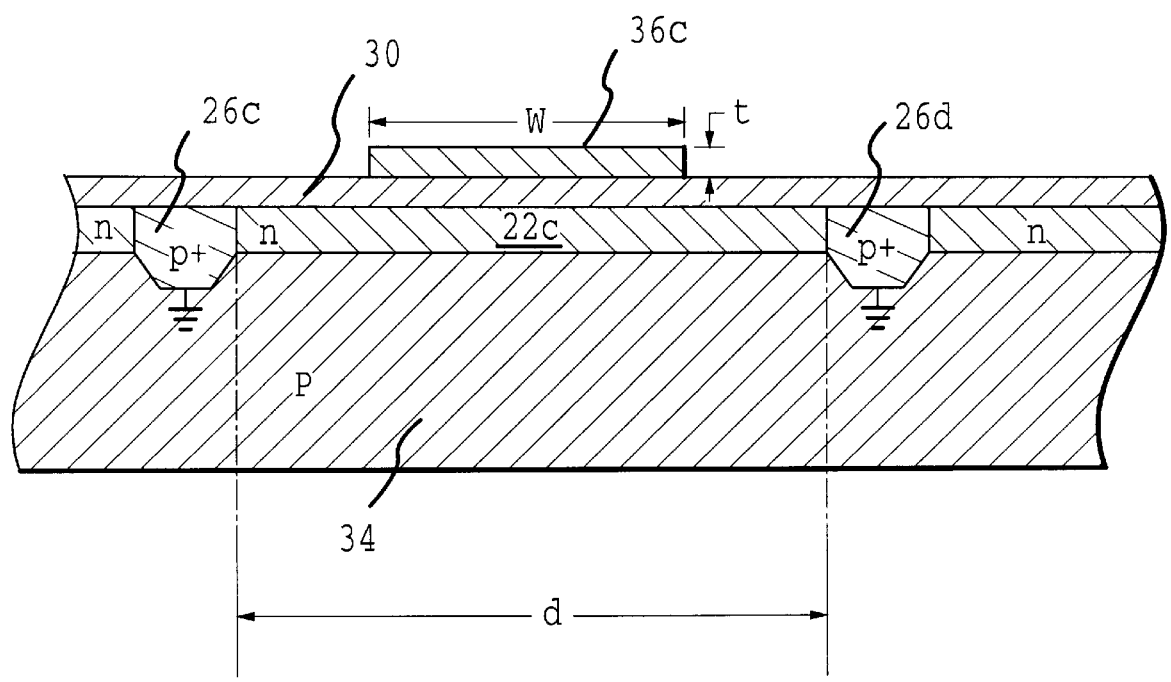
FIG. 2 is a partial cross-sectional view taken along line 2—2 in FIG. 1.

Referring to FIG. 2, the radiation sensing means 14 includes a first material forming a plurality of adjacent channels 22a–n for transferring electrical charge, a second material forming a plurality of adjacent channel stops 26a–n for retaining the electrical charge in the channel, an oxide material 30 overlying the first and second materials, and a substrate 34 supporting the first and second materials and the oxide material. The first and second materials and substrate are preferably any suitable material, including Si, Ge, and InGaAs, that is photoactive and can be doped as an n- or p-type material. The first and second materials and substrate are typically formed from the same base material but are doped differently. The oxide material 30 is preferably an oxide of the substrate 34 material such as silicon dioxide.

The biasing means 18 includes a plurality of column electrodes 36a–n, drive electrodes 40a,b, summing electrodes 44a–n, dump gate 48, scan gates 52 and 56, and horizontal readout register 60. The dump gate 48 is connected to suitable dump driver circuitry 64; the horizontal readout register 60 to suitable readout driver circuitry 68; and the summing electrodes 44a–n to suitable summing electrode driver circuitry 70. As will be appreciated, the CCD 10 can have as many channels (i.e., pixels) and associated column electrodes as desired.

The column electrodes 36a–n are substantially transparent to incident radiation. The column electrodes 36a–n are preferably a semiconductor such as polysilicon. The column electrodes 36a–n are oriented substantially parallel with the channels 22a–n and are in a corresponding one-to-one relationship with the channels. Each of the column electrodes is substantially continuous over the length of the corresponding channel and define a substantially continuous potential well in the channels.

The widths ("w") and thicknesses ("t") of the column electrodes 36a–n are determined by several factors. First, the quantum efficiency of the CCD can be increased by decreasing the width and/or thickness of the electrodes. Second, the RC time constant associated with building up of the potential gradient 80 along the length of the electrode 36 is increased by decreasing the cross-sectional areas of the electrodes. The RC time constant is determined by the maximum frequency of charge readout from the channels. Third, the widths of the electrodes are determined by the maximum well capacity. Finally, the widths and/or thicknesses are determined by processing constraints. Because the RC time constant can be relatively long (due to the use of relatively few charge shifts during each readout cycle) and the maximum well capacity relatively small, the electrodes 36a–n have relatively small widths, thicknesses and cross-sectional areas. Preferably, the electrode width "w" is no more than about 50% and more preferably 5% of the distance "d" between adjacent channel stops (i.e., the width of the channel). The electrode width "w" preferably ranges from about 20 micrometers to about 1 micrometer.

The drive electrodes 40a,b connect each of the upper and lower ends of the column electrodes 36a–n together in parallel. The drive electrodes 40a,b are connected to metal pads (not shown) for wire bonding. As will be appreciated, any suitable bonding technique can be employed to connect the drive electrodes to the column electrodes. The drive electrodes are composed of a highly conductive material, with metal being most preferred.

Summing electrodes 44a–n are located at the lower ends of the channels 22a–n and are in a corresponding one-to-one relationship with the channels 22a–n and the column electrodes 36a–n. Summing wells defined by the electrodes 44a–n collect electrical charge from the corresponding channel for transfer to the horizontal readout register 60.

The dump gate 48 applies a voltage to the first material via a dump gate electrode 50 to define a potential well beneath the dump gate electrode 50. The potential well permits electrical charge to pass from the potential well defined the drive electrode 36, beneath the dump gate electrode 50, and along the output electrode circuitry 96 towards the bias voltage source 84. The dump gate is a MOSFET or another suitable transistor configuration.

During charge shifting, the scan gates 52 and 56 apply different voltages to the upper and lower ends of the column electrodes to form the potential gradient 80 along the length of each column electrode 36a–n. Thus, during charge transfer from the channels to the corresponding summing well, scan gate 52 applies a voltage to the upper ends of the electrodes via the drive electrode 40a that is less than the voltage applied by scan gate 56 to the lower ends of the electrodes via the drive electrode 40b. During dumping of electrical charge through the dump gate 48, scan gate 52 applies a voltage to the upper ends of the electrodes via the drive electrode 40a, the absolute value of which is more than the absolute value of the voltage applied to the lower ends of the electrodes via the drive electrode 40b by scan gate 56. During integration and charge migration, the absolute value of the voltage applied by scan gate 52 is preferably no more than about 500% and more preferably ranges from about 200 to about 300% of the absolute value of the voltage applied by scan gate 56. Preferably the difference between the absolute values of the voltages applied by scan gates 52 and 56 ranges from about 5 to about 25 volts. During dumping of the charge, the absolute value of the voltage applied by scan gate 56 is preferably no more than about 500% and more preferably ranges from about 200 to about 300% of the absolute value of the voltage applied by scan gate 52. Preferably the difference between the absolute values of the voltages applied by scan gates 56 and 52 ranges from about 5 to about 25 volts.

The horizontal readout register 60 is configured as is well known in the art. The readout phase clock drive circuitry can be any number of phases, with two phases being most preferred for purposes of cost and simplicity.

The operation of the CCD 10 will now be described with reference to FIGS. 1–7. Between time "$t_0$" and time "$t_1$" (i.e., the charge integration interval), filtered or unfiltered incident radiation contacts the front of the CCD 10, passing through the column electrodes 36a–n and generating electrical charges in each of the channels 22a–n upon contact of the radiation with the first material. The electrical potential of the drive electrodes 40a,b and therefore of column electrodes 36a–n is "$V_1$", the absolute value of which is below the absolute value of the CCD inversion potential. In this manner, the dark current is substantially minimized during the charge integration interval. Between time "$t_1$", and time "$t_2$" (i.e., the charge shifting interval), the accumulated electrical charge in the channels 22a–n are transferred to a potential well corresponding to each channel. The potential wells, or summing wells, are defined by summing electrodes 44a–n. To form a potential gradient along the entire length of each channel to transfer the electrical charge to the Bumming wells, scan gate 52 energizes the drive electrode 40a and therefore the upper ends of the column electrodes 36a–n with a voltage "$V_2$," and the scan gate 56 energizes drive electrode 40b and therefore the lower ends of the column electrodes 36a–n with a voltage "$V_3$", the absolute value of which is greater than the absolute value of "$V_2$", to form the potential gradient. The potential gradient 80 therefore slopes downward towards the lower ends of the electrodes 36a–n causing the electrical charges to migrate towards the lower ends of the electrodes 36a–n, as shown in FIG. 5. The summing electrodes 44a–n are energized with a voltage "$V_4$", the absolute value of which is greater than the absolute value of "$V_2$", to form the summing wells below the summing electrodes 44a–n that are deeper than any other portion of the potential well along the length of the corresponding column electrode. The cumulative electrical charge for each channel therefore collects in the various summing wells during the charge shifting interval.

Figure 4:
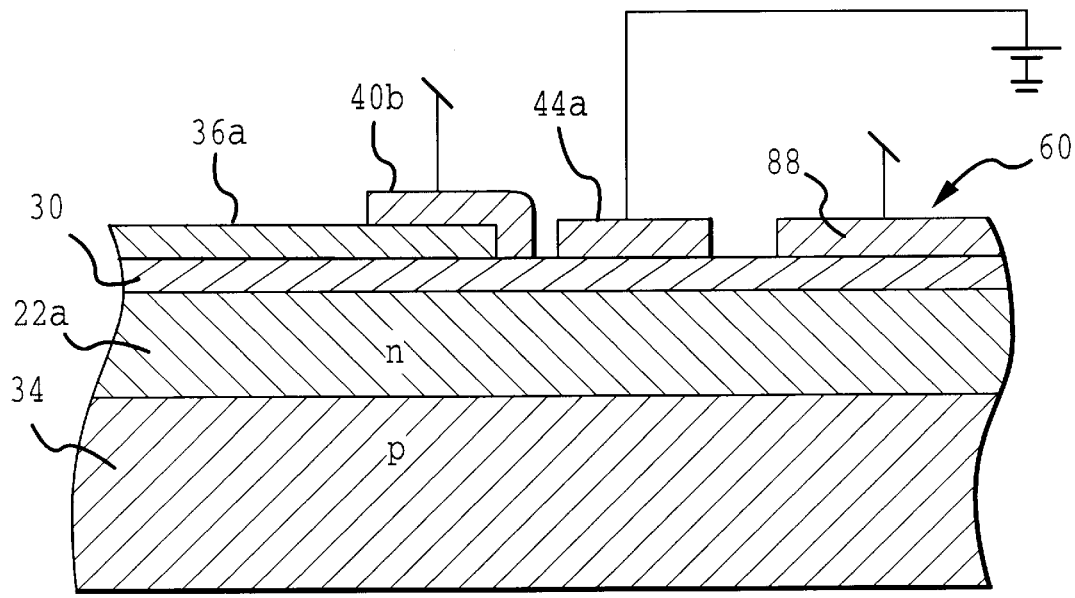
FIG. 4 is a partial cross-sectional view taken along line 4—4 FIG. 1.
Figure 5:
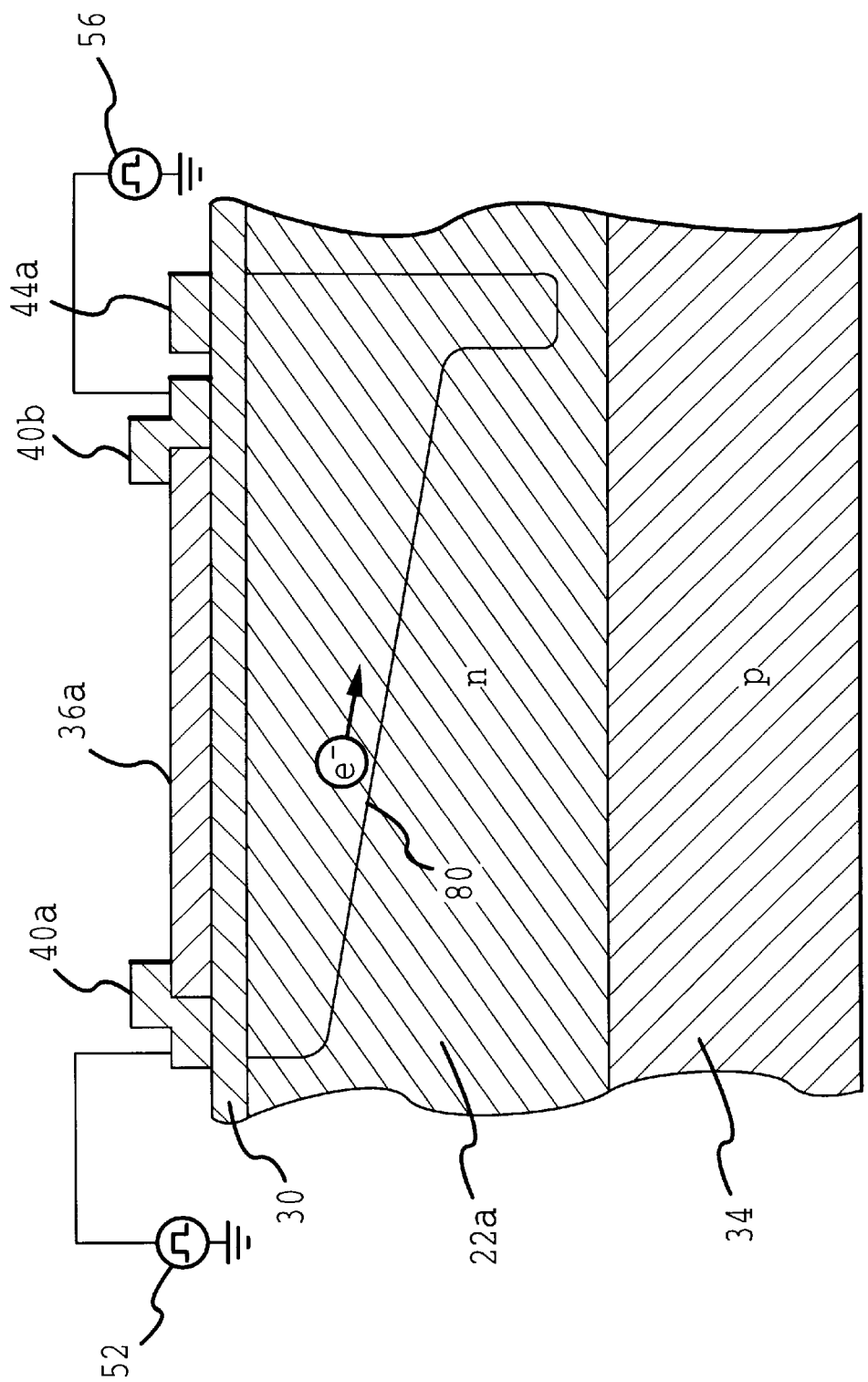
FIGS. 5 and 6 are partial cross-sectional views taken along line 5, 6—5, 6 in FIG. 1.

Referring to FIG. 4, immediately before time "$t_1$", the plate electrodes 88 of the horizontal readout register 60 that are nearest the summing electrodes 44a–n are energized with a voltage "$V_5$", the absolute value of which is more than the absolute value of "$V_4$", to define a potential well beneath each of the adjacent plate electrodes that is deeper than the corresponding summing well and thereby cause the accumulated electrical charge in each of the summing wells to be transferred into the potential well defined by each of the corresponding plate electrodes. The horizontal readout register 60 then shifts the accumulated electric charge for each channel from the CCD 10, through an output MOSFET or other suitable circuitry which converts the electrical charge into a signal for each channel, and the resulting signals are forwarded to an amplifier (not shown). The amplified signal for each channel is then forwarded to a signal processor (not shown) for analysis.

Figure 3:
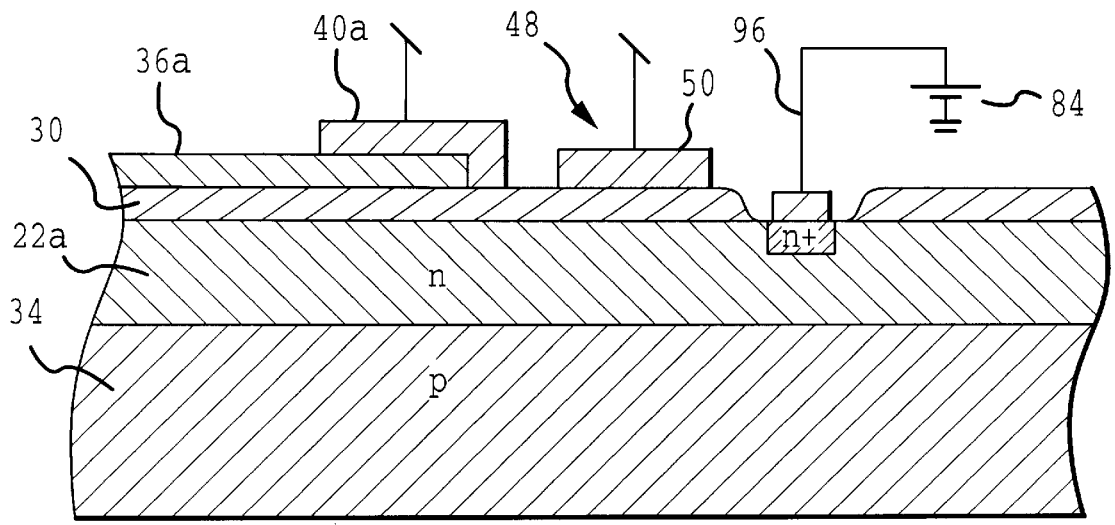
FIG. 3 is a partial cross-sectional view taken along line 3—3 in FIG. 1.
Figure 6:
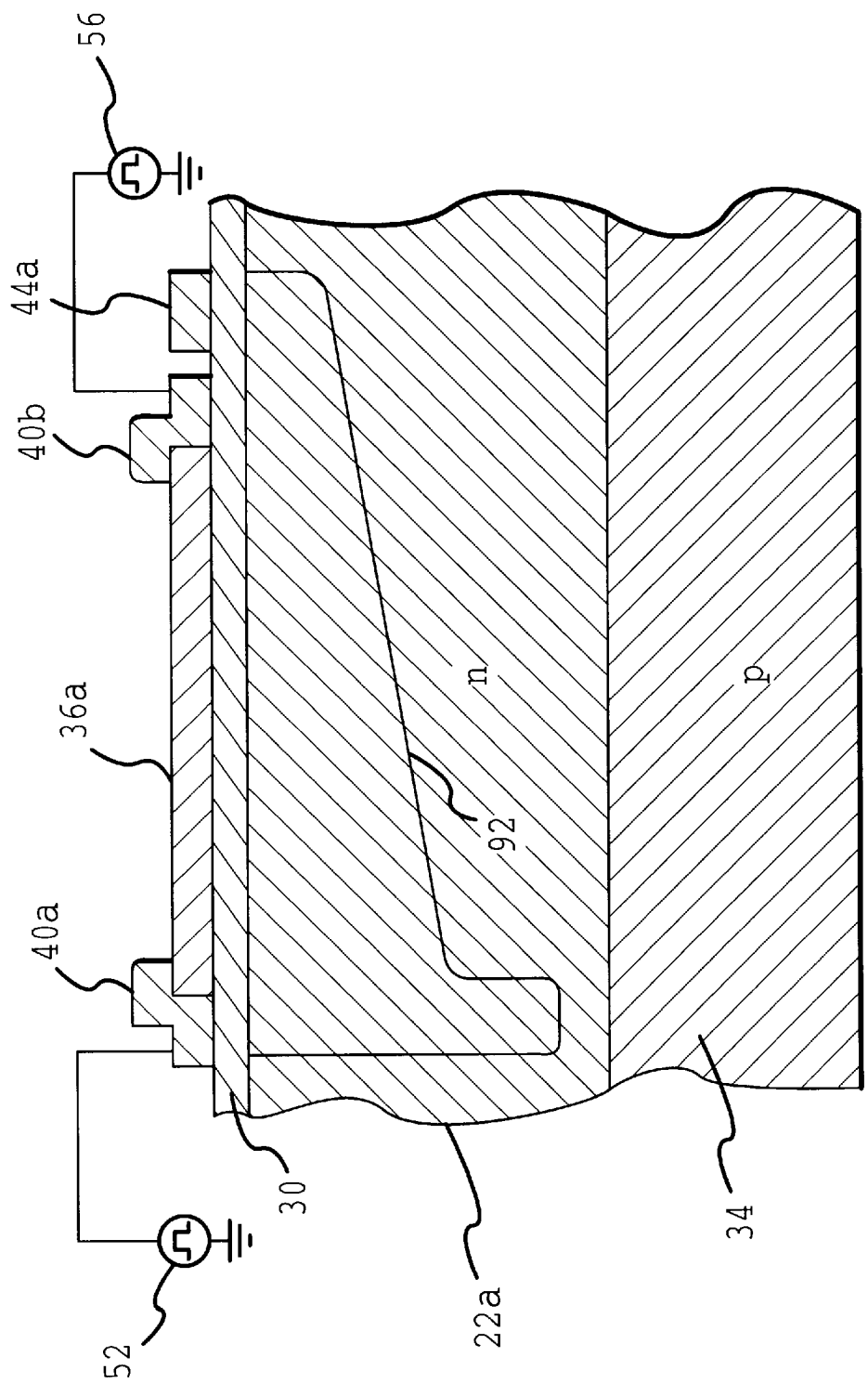
Figure 7:
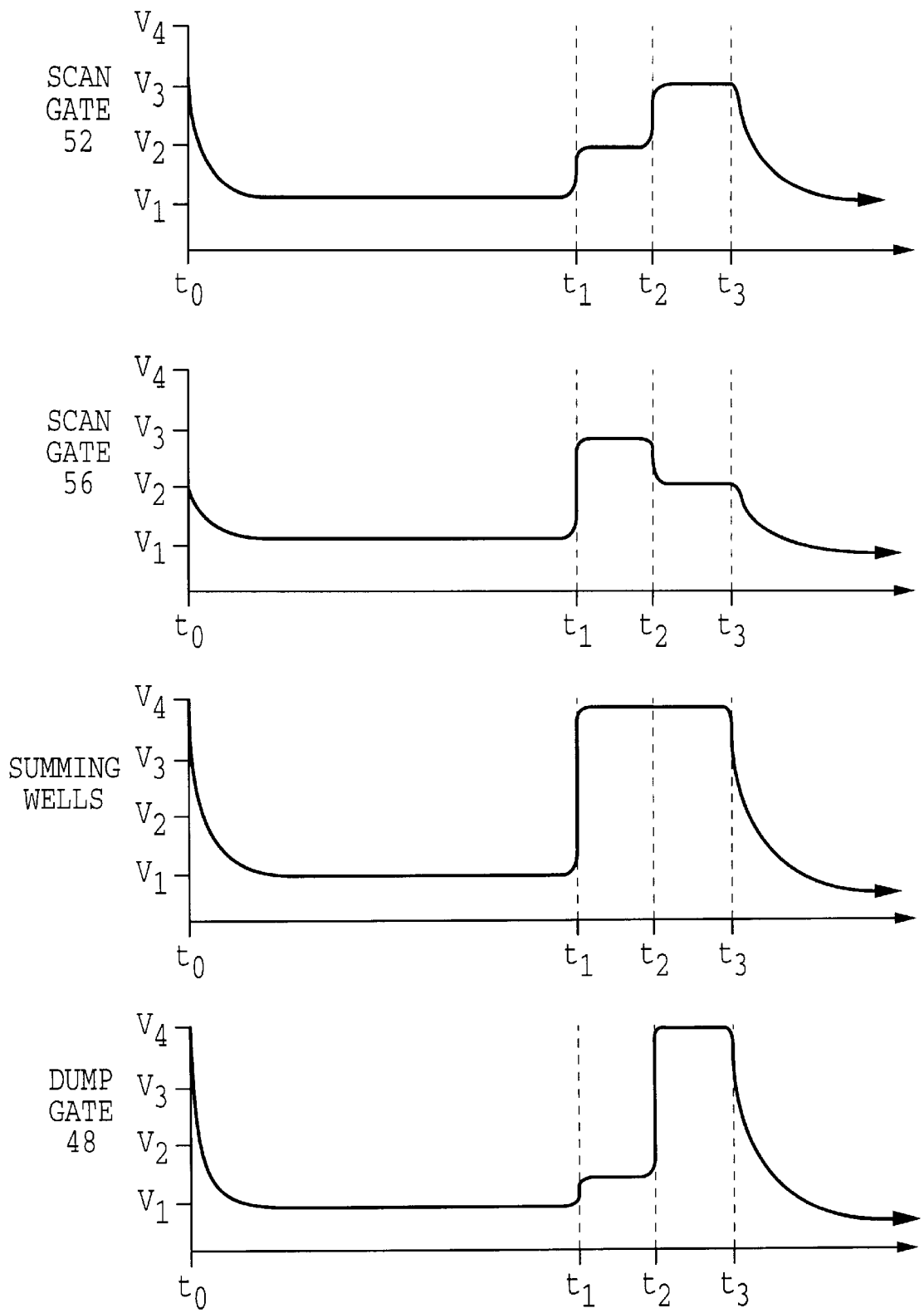
FIG. 7 depicts input voltage waveforms for various inputs into the CCD.

Between time "$t_2$" and "$t_3$" (i.e., the charge dumping interval), the residual electrical charge in each channel is removed from the channel. Residual electrical charge can be generated by incident radiation and dark current. As shown in FIG. 6, the scan gate 52 applies the voltage "$V_3$" to the upper ends of the electrodes 36a–n and the scan gate 56 applies the voltage "$V_2$" to the lower ends of the electrodes 36a–n, thereby causing the potential gradient 92 to slope downward towards the upper ends of the electrodes 36a–n. The residual electrical charge in each channel collects in a potential well defined by the drive electrode 40a. As shown in FIG. 3, at time "$t_3$" (i.e., a time period that is sufficient period of time for the residual charge to collect in the potential well), the voltage "$V_4$" is applied to the dump electrode 50 to cause the electrical charge to pass through the output electrode circuitry 96. The output electrode circuitry 96 is energized with a voltage "$V_6$" by a voltage source 84. The absolute value of the voltage "$V_6$" is greater than the absolute value of the voltage "$V_4$".

As will be appreciated, the width of the interval between $t_2$ and $t_3$ depends upon the application. By way of example, for applications where the incident radiation substantially continuously contacts the CCD the interval is short. For applications where the incident radiation intermittently contacts the CCD (such as applications using pulsed radiation sources) the interval can be long.

After time "$t_3$", the voltages of the scan gates 52 and 56 are again at "$V_1$". The dump gate electrode 50 is energized with a voltage that is no more than "$V_1$" to block electrical charge from migrating to the output electrode circuitry. The above-noted steps are repeated as desired to complete the analysis of the incident radiation.

In another aspect of the present invention, the column electrodes 36a–n are biased substantially continuously with electrical potentials above the CCD inversion potential. Referring to FIG. 8, scan gates 52 and 56 are biased with voltages "$V_2$" and "$V_3$", respectively, during the time interval "$t_0$" through "$t_1$" (i.e., the integration interval). The resulting potential gradient causes the electrical charge to migrate to the summing well, which is biased with the voltage "$V_4$" substantially immediately after generation of the electrical charge. Between the time interval "$t_1$" through "$t_2$", scan gates 52 and 56 are biased with voltages "$V_3$" and "$V_2$", respectively, to cause electrical charge in the channels to be cleared via the dump gate 48 as noted above.

In yet another aspect of the present invention, one or more of the column electrodes 36a–n are energized with different voltages at different times to vary the exposure time of the channels to incident radiation and provide signals from each channel having improved signal-to-noise ratios. By way of example, in applications where incident radiation is filtered such as by a linear variable filter to provide filtered radiation that is spatially distributed by wavelength across the face of the CCD, it is desirable to have a greater frequency of readout cycles for portions of the spectra having a higher charge generation rate and a lower frequency of readout cycles for portions of the spectra having a lower charge generation rate.

Figure 9:
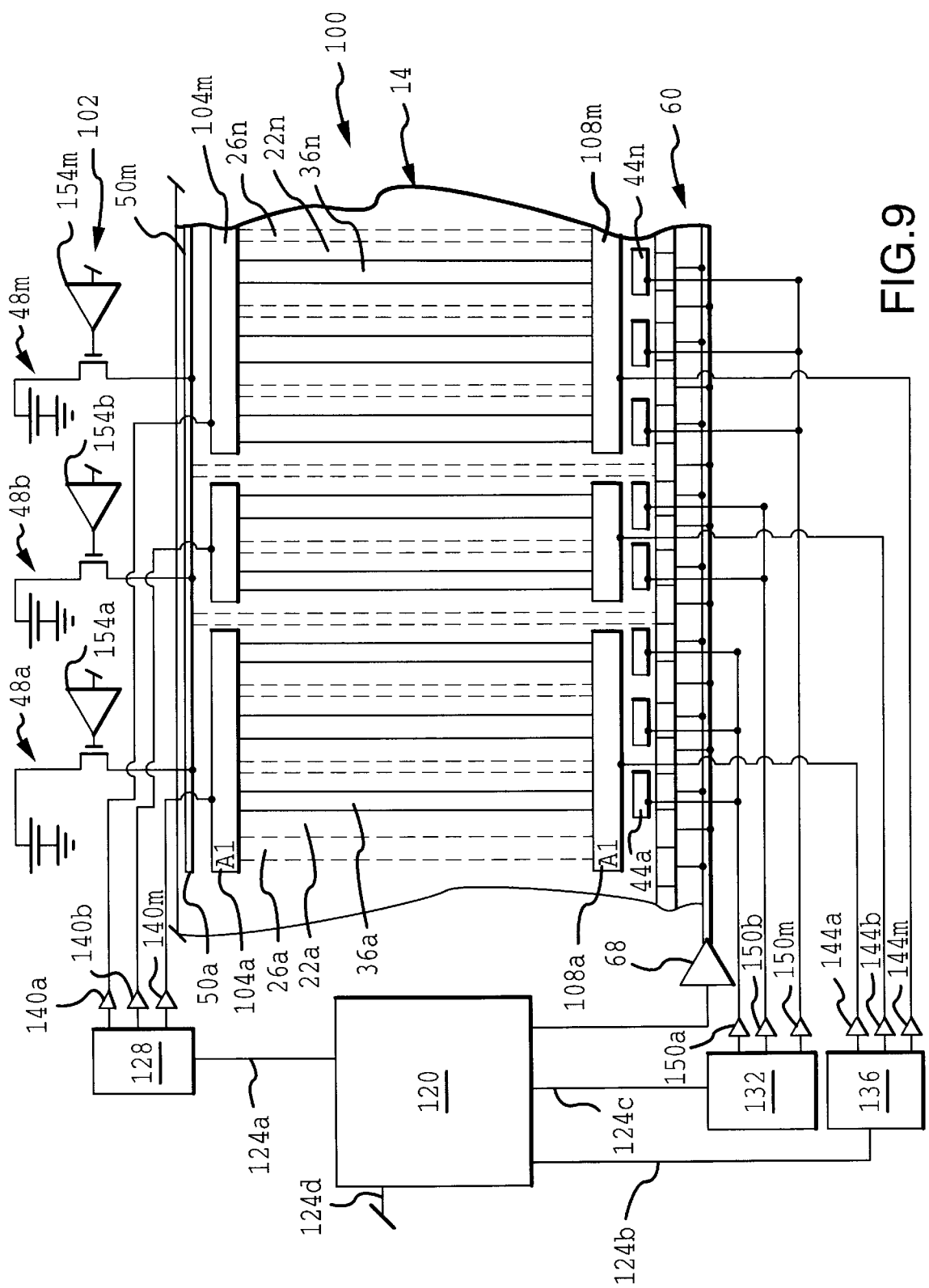
FIG. 9 is a plan view of a CCD according to another embodiment of the present invention.

Referring to FIG. 9, a CCD 100 for selectively reading out electrical charge for different channels is depicted. The CCD is a linear array having n columns (i.e., n pixels). The CCD includes biasing means 102 and radiation sensing means 14. Biasing means 102 includes a plurality of column electrodes 36a–n, a plurality of summing electrodes 44a–n connected to a plurality of summing electrode drivers 150a–m, a plurality of drive electrodes 104a–m and 108 a–m respectively connected to a plurality of drive electrode drivers 140a–m and 144a–m, a plurality of dump gates 48a–m connected to a plurality of dump gate drivers 154a–m, a plurality of decoders 128, 132, and 136 connected to the various groups of drivers, a horizontal readout register 60, and a controller 120. The column electrodes 36a–n are divided into m groups with the number of electrodes in each group depending upon the application.

The controller 120 provides digital codes, for example, via data lines 124a–c to the decoders 128, 132, and 136. Decoders 128 and 136 respectively produce m outputs which are inputs to the drive electrode drivers 140a–m and 144a–m. The outputs of the drivers selectively energize the upper drive electrodes 104a–n of the m selectable electrode groups in accordance with data on data lines 124a. In a similar manner, outputs of the drivers 144a–m selectively energize the lower drive electrodes 108a–n of the m selectable electrode groups in accordance with data on data lines 124b. Decoder 132 also produces m outputs which are inputs to the summing electrode drivers 150a–m. The outputs of the drivers selectively energize the summing electrodes 44a–n of the m selectable electrode groups in accordance with data on data lines 124c. The dump gate drivers 154a–m are controlled via data lines 124d via another decoder (not shown) by the controller 120 in the same manner. A readout register driver 68 provides voltages to electrode plates in the horizontal readout register. It should be mentioned that decoders 128, 132, and 136 can be implemented using a wide range of different hardware configurations. For example, programmable logic arrays can be utilized or a number of readily available logic encoders can be adapted for use in the CCD. As will be appreciated, the device of FIG. 9 can be modified and/or reconfigured in various ways as are well known in the art.

The operation of the CCD 100 will now be described with reference to a CCD used for selectively monitoring specific wavelength ranges of incident radiation spatially distributed along the face of the CCD. To selectively monitor the selected wavelength ranges, the channels are divided into m selectable groups as noted above with each group corresponding to specific wavelengths of the spectrum. For purposes of simplicity, the operations of only the first and second groups will be described.

During a first time interval, the channels in the first and second groups are in the charge integration and collection mode. Thus, the drive electrodes 104, 108 corresponding to channels in the first and second groups are energized with $V_1$ by the corresponding drive electrode drivers 144a–m, 140a–m to form a potential gradient sloping downwards towards the corresponding summing electrodes 44. During a second time interval, the drive electrodes 104 corresponding to the channels in the first group are biased with a voltage "$V_2$" and drive electrodes 108 corresponding to the channels in the second group with a voltage "$V_3$". The corresponding summing electrodes 44 are energized by the respective summing electrode driver 150 with a voltage $V_4$ to cause the electrical charge(s) formed in the channel corresponding to each of the respective summing electrodes to collect in the summing well defined thereby.

During a third time interval, the cumulative electrical charges in the summing wells for the first group are transferred to the horizontal readout register 60 and the residual electrical charge in each of the channels in the first group cleared while the second group of channels are maintained in the charge integration and collection mode. Thus, the respective summing wells for the first group are energized with a voltage above $V_3$ but lower than a voltage applied to the adjacent plate electrodes in the horizontal readout register to transfer the electrical charges in the respective summing wells for the first group to the potential wells defined by the corresponding adjacent plate electrodes. After the transfer of the electrical charges to the potential well defined by the plate electrodes, the drive electrodes 104 in the first group are energized with $V_3$ while the respective drive electrodes 108 are energized with $V_2$ to form a potential gradient sloping downwards towards the drive electrodes 104 to transfer electrical charges in the respective channels to the potential wells defined by the respective drive electrodes. The dump gate electrodes corresponding to the channels in the first group are energized with a voltage greater than $V_3$ to transfer the charges to the corresponding output electrode circuitry 96.

Also during a fourth time interval (that is subsequent to the second time interval), the drive electrodes 104 corresponding to the channels in the second group are energized with $V_2$ by the corresponding drive electrode driver 140, and each of the drive electrodes 108 corresponding to channels in the second group are energized with $V_3$ by the corresponding drive electrode driver 144 to form a potential gradient sloping downwards towards the corresponding summing electrodes 44. The corresponding summing electrodes 44 are energized by the respective summing electrode driver 150 with a voltage $V_4$ to cause the electrical charge(s) formed in the channel corresponding to each of the respective summing electrodes to collect in the summing well defined thereby.

The identities and number of channels in each of the first and second groups can be selected as desired to meet the requirements of the specific application. During any given time interval, it is possible to have some channels performing charge integration and collection, other channels performing charge transfer to corresponding adjacent plate electrodes, and/or yet other channels performing charge clearing.

In a further aspect of the present invention, the column electrodes 36a–n are biased in the same manner over time, and the exposure time of each of the channels to incident radiation is varied by selectively biasing only the summing wells. Thus, all of the channels are simultaneously in charge integration, charge shifting, or charge dumping while the accumulated electrical charge in some summing wells is maintained in the summing wells for a longer period of time than the accumulated electrical charge in other summing wells. This is done by maintaining a voltage "$V_5$" in the summing wells that are to hold electrical charge for a longer time period that is greater than the voltage of the adjacent electrode plates in the horizontal readout register 60.

Figure 10:
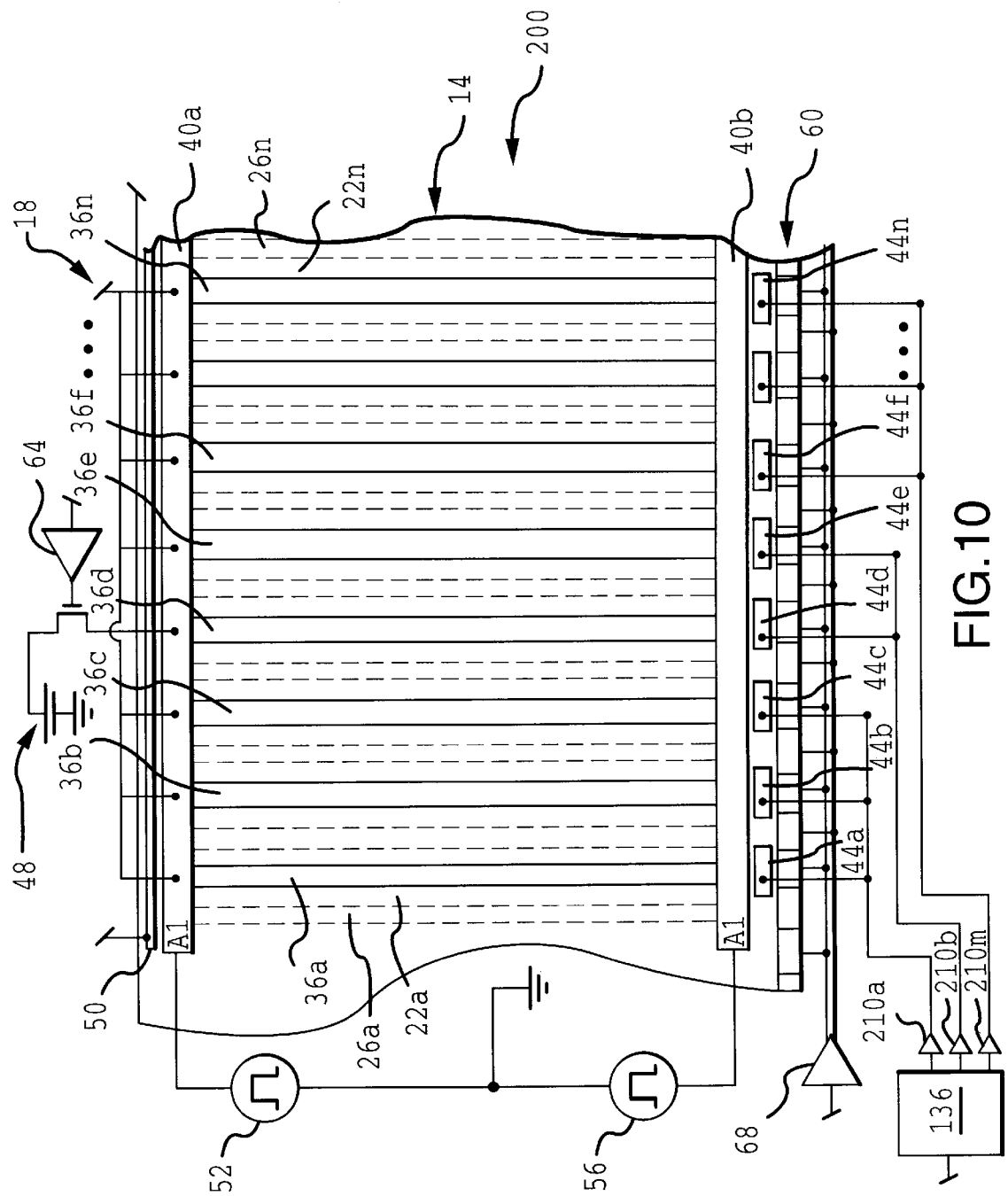
FIG. 10 is a plan view of a CCD according to another embodiment of the present invention.

Referring to FIG. 10, a CCD 200 for selectively reading out electrical charge for different channels is depicted. The summing wells are divided into m groups with the number of summing wells in each group depending upon the application. Decoder 136 respectively produces m outputs which are inputs to the summing electrode drivers 210a–m. The outputs of the summing electrode drivers 210a–m selectively energize the summing electrodes 44a–n of the m selectable electrode groups as determined by a controller (not shown).

While various embodiments of the present invention have been described in detail, it is apparent that modifications and adaptations of those embodiments will occur to those skilled in the art. For example, it should be appreciated that the waveforms and associated circuitry and the CCD configuration can be modified in an unlimited number of ways within the framework of the teachings of the present invention. These variations are all considered to fall within the scope of the present invention provided that the potential gradient concept as taught herein is applied. Therefore, it is to be expressly understood that such modifications and adaptations are within the spirit and scope of the present invention, as group forth in the following claims.

What is claimed is:

1. A charge coupled device (CCD) for sensing radiation, comprising:

radiation sensing means for generating electrical charge in response to incident radiation received along a length of the radiation sensing means throughout a first selected time interval;

charge storage means for storing the electrical charge; and biasing means for establishing, within the radiation sensing means, a potential gradient along the length of the radiation sensing means to transfer the electrical charge within the radiation sensing means to the charge storage means during a second selected time interval, wherein, substantially continuously throughout the second selected time interval, a first electrical potential along the potential gradient is more than a second electrical potential at a different location along the potential gradient.

2. The CCD of claim 1, wherein the radiation sensing means comprises a first material forming a plurality of parallel channels for transferring the electrical charge and the biasing means comprises a plurality of adjacent electrodes arranged in a corresponding one-to-one relationship with the plurality of channels.

3. The CCD of claim 1, wherein the radiation sensing means includes a first material forming a plurality of parallel channels for transferring the electrical charge and the biasing means includes a plurality of parallel electrodes and wherein the plurality of parallel electrodes are substantially parallel to the plurality of channels.

4. The CCD of claim 1, wherein the biasing means comprises:

a first voltage source having a first voltage level connected to a first end of an electrode; and a second voltage source having a second voltage level connected to a second end of the electrode, wherein the first voltage level is less than the second voltage level to form the potential gradient.

5. The CCD of claim 4, wherein the first voltage level is no more than about 500% of the second voltage level.

6. The CCD of claim 1, wherein the radiation sensing means comprises:

a first material forming a plurality of adjacent channels for transferring the electrical charge; and a second material forming a plurality of adjacent channel stops for retaining the electrical charge in a channel, a channel stop being located between pairs of adjacent channels, and wherein the biasing means includes an electrode, the electrode having a width less than a distance between adjacent channel stops.

7. The CCD of claim 6, wherein the width is no more than about 50% of the distance.

8. The CCD of claim 1, wherein the biasing means includes a plurality of adjacent electrodes and the plurality of adjacent electrodes are electrically connected in parallel to a common voltage source.

9. The CCD of claim 1, further comprising a horizontal charge readout register comprising a plurality of summing wells with a summing well corresponding to each of a plurality of radiation sensing means.

10. The CCD of claim 1, comprising a plurality of charge storage means and wherein the radiation sensing means comprises a first material forming a plurality of adjacent channels for transferring electrical charge and the biasing means comprises means for transferring, over the second selected time interval, electrical charges stored in at least one of a first channel and a first charge storage means to a horizontal readout register and, over a third selected time interval discrete from the second selected time interval, electrical charges stored in at least one of a second channel and a second charge storage means to the horizontal readout register.

11. The CCD of claim 1, wherein the biasing means comprises a plurality of drive electrodes connected to a plurality of column electrodes, with the column electrodes being substantially transparent to radiation.

12. The CCD of claim 11, wherein each of the plurality of column electrodes is substantially parallel to the radiation sensing means.

13. The CCD of claim 12, wherein each of the plurality of column electrodes has substantially the same length as the radiation sensing means.

14. The CCD of claim 1, wherein the biasing means comprises an electrode and an arrangement configured for biasing a first end of the electrode with a first voltage during the first selected time interval and a second voltage during the second selected time interval, the first voltage being different than the second voltage and the first selected time interval being discrete from the second selected time interval, such that a first portion of the electrical charge is transferred to the first end during the first selected time interval and a second portion of the electrical charge is transferred to a second end of the electrode during the second selected time interval.

15. The CCD of claim 14, wherein the arrangement includes a transistor for transferring at least one of the first and second portions of the electrical charge out of the radiation sensing means.

16. The CCD of claim 1, wherein the magnitude of the electrical potential varies continuously along the length of the radiation sensing means.

17. The CCD of claim 1, wherein the potential gradient is defined by a linear function.

18. A charge coupled device (CCD), comprising:

charge holding means for generating an electrical charge in response to incident radiation and for holding the generated electrical charge, the charge holding means having a first length; and an arrangement configured for establishing a gradient in electrical potential, within the charge holding means, along the first length, the arrangement being in electrical contact with the charge holding means to transfer, within the charge holding means, electrical charge along the first length in response to the potential gradient, wherein the magnitude of the electrical potential varies continuously along the first length.

19. The CCD of claim 18, wherein the arrangement includes:

an electrode, the electrode having a first end and a second end, a first voltage source having a first voltage level connected to the first end and a second voltage source having a second voltage level connected to the second end, wherein the first voltage level is less than the second voltage level to form the potential gradient.

20. The CCD of claim 18, wherein the arrangement includes an electrode having first and second ends, the electrical potential existing between the first and second ends, and wherein, along the potential gradient, each electrical potential is more than an adjacent electrical potential, the adjacent electrical potential being nearer the second end than said each electrical potential.

21. The CCD of claim 18, wherein the potential gradient is defined by a substantially linear function.

22. The CCD of claim 18, wherein the arrangement includes a continuous electrode extending the first length.

23. The CCD of claim 18, wherein the arrangement includes an electrode having an upper end and a lower end and the charge holding means comprises a charge dumping well adjacent to the upper end and a summing well adjacent to the lower end.

24. The CCD of claim 18, wherein the charge holding means comprises a potential well that is substantially continuous along the first length.

25. A CCD for sensing radiation, comprising:
a plurality of column electrodes, with each said column electrode having a length extending in a longitudinal direction;
a plurality of channels for generating electrical charge in response to incident radiation received along the channels throughout a selected time interval, with each channel having a length, extending in said longitudinal direction, and the plurality of column electrodes being substantially parallel to the plurality of the channels along the lengths of the column electrodes, wherein at least a portion of each said column electrode overlies at least a portion of one of said channels, such that the portion of the channel and the corresponding overlying portion of the column electrode extend substantially in parallel in said longitudinal direction; and
an energy source for biasing the plurality of column electrodes and thereby transferring the electrical charge in the plurality of the channels along the lengths of channels.

26. The CCD of claim 25, wherein the energy source comprises first and second voltage sources, with the first voltage source being connected to upper ends of the plurality of electrodes and the second voltage source being connected to lower ends of the plurality of electrodes, and the first and second voltage sources having different voltage levels.

27. The CCD of claim 25, wherein the energy source establishes a potential gradient along the lengths of the plurality of electrodes.

28. The CCD of claim 25, wherein the plurality of channels generate electrical charge throughout substantially all of the selected time interval and the energy source transfers electrical charge along the plurality of channels substantially continuously throughout the selected time interval.

29. The CCD of claim 25, wherein said plurality of channels are arranged in a linear array.

30. The CCD of claim 25, wherein said channels are separated from each other by channel stops located between any two adjacent of said channels, and said column electrodes substantially do not overlie any portion of said channel stops.

31. The CCD of claim 25, wherein each said channel includes, at opposing ends of said length, a first terminal end and a second terminal end; and
adjacent each said first terminal end is a first drive electrode in connection with the corresponding column electrode and adjacent each said second terminal end is a second drive electrode in connection with the corresponding column electrode; and
said first drive electrode and said second drive electrode being independently activatable to apply different voltages adjacent said first terminal end and adjacent the second terminal, to form a potential gradient along the length of the corresponding channel.

32. The CCD of claim 31, wherein said first and second drive electrodes are activatable in a first mode so that a lower voltage is applied adjacent said first terminal end than is applied adjacent said second terminal end, so that charges within the corresponding channel are transported to adjacent said second terminal end during said first mode; and
said first and second drive electrodes are activatable in a second mode so that a higher voltage is applied adjacent said first terminal end than is applied adjacent said second terminal end, so that charges within the corresponding channel are transported adjacent said first terminal end during said second mode.

33. The CCD of claim 31, wherein a first plurality of said column electrodes are connected in parallel between a first said first drive electrode and a first said second drive electrode, and a second plurality of said column electrodes are connected in parallel between a second said first drive electrode and a second said second drive electrode, so that said first plurality of said column electrodes and said second plurality of said column electrodes are independently activatable.

34. The CCD of claim 31, wherein adjacent each said second terminal end is a summing electrode that is activatable to apply a voltage adjacent to the second terminal end to accumulate charges in the corresponding channel adjacent the second terminal end.

35. The CCD of claim 34, wherein each of said channels corresponds with a different said summing electrode, so that said charges are accumulated separately for each of said channels.

36. The CCD of claim 34, wherein adjacent each said first terminal end is a dump gate electrode that is activatable to apply a voltage adjacent to the first terminal end to accumulate charges in the corresponding channel adjacent the first terminal end.

37. The CCD of claim 36, wherein said dump gate electrode is activatable to simultaneously apply a voltage in substantially all of said channels adjacent said first terminal ends, to simultaneously accumulate charges in substantially all of said channels adjacent said first terminal ends.

38. The CCD of claim 36, wherein a first said dump gate electrode is located adjacent said first terminal ends of a first plurality of said channels and a second said dump gate electrode is located adjacent said first terminal ends of a second plurality of said channels, so that charges are accumulated adjacent said first terminal ends in said first plurality of channels adjacent separately from accumulation of charges adjacent said second terminal ends in said second plurality of channels adjacent.

* * * * *